United States Patent
Ghotgalkar et al.

(10) Patent No.: US 11,990,914 B2
(45) Date of Patent: May 21, 2024

(54) PHASE LOCK LOOP REFERENCE LOSS DETECTION

(71) Applicant: TEXAS INSTRUMENTS INCORPORATED, Dallas, TX (US)

(72) Inventors: Shailesh Ganapat Ghotgalkar, Bangalore (IN); Wei Fu, Plano, TX (US); Venkatseema Das, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/550,123

(22) Filed: Dec. 14, 2021

(65) Prior Publication Data
US 2022/0103181 A1    Mar. 31, 2022

Related U.S. Application Data

(63) Continuation of application No. 16/940,880, filed on Jul. 28, 2020, now Pat. No. 11,239,847, which is a continuation of application No. 16/167,440, filed on Oct. 22, 2018, now Pat. No. 10,727,841.

(51) Int. Cl.
*H03L 7/087* (2006.01)
*H03L 7/099* (2006.01)

(52) U.S. Cl.
CPC .......... *H03L 7/087* (2013.01); *H03L 7/099* (2013.01)

(58) Field of Classification Search
USPC ........................................... 331/25
See application file for complete search history.

(56) References Cited

U.S. PATENT DOCUMENTS

| | | | | |
|---|---|---|---|---|
| 8,487,707 | B2 * | 7/2013 | Wang | H03L 7/113 331/25 |
| 8,564,374 | B2 * | 10/2013 | Chiu | H03L 7/097 331/25 |
| 10,727,841 | B2 | 7/2020 | Ghotgalkar et al. | |
| 2013/0127549 | A1 * | 5/2013 | Dreux | G06F 21/75 331/56 |
| 2014/0002155 | A1 | 1/2014 | Park et al. | |
| 2016/0164532 | A1 | 6/2016 | Zhang et al. | |
| 2019/0068204 | A1 | 2/2019 | Yamaguchi | |

* cited by examiner

*Primary Examiner* — Joseph Chang
(74) *Attorney, Agent, or Firm* — Mandy Barsilai Fernandez; Frank D. Cimino

(57) ABSTRACT

In described examples, a first clock generator generates an output clock signal in response to an input reference signal and in response to a feedback signal that is generated in response to the output clock signal. A code generator generates a code in response to the input reference signal. A loss detector generates an indication of a loss of the input reference signal in response to the feedback signal and at least two codes generated by the code generator.

20 Claims, 3 Drawing Sheets

PHASE LOCK LOOP REFERENCE LOSS DETECTION

CROSS-REFERENCE TO RELATED APPLICATIONS

This application is a continuation of and claims priority to U.S. patent application Ser. No. 16/940,880 filed Jul. 28, 2020, which is a continuation of and claims priority to U.S. patent application Ser. No. 16/167,440, filed Oct. 22, 2018, now U.S. Pat. No. 10,727,841, each of which are incorporated by reference herein in their entireties.

BACKGROUND

Modern electronic systems such as radio-enabled systems and/or microprocessor systems often generate a local clock signal that is synchronized to an external clock. Such clock generation systems often include a phase lock loop (PLL) circuit, which is phase synchronized to an input reference signal. Various faults can occur in the reception of the input reference signal, such that the receiving of the input reference signal by the PLL is interrupted. Failure of the PLL circuit to properly generate a local system clock can result in a loss of the integrity of the PLL-generated system clock. A lack of prompt detection and/or mitigation of the loss of the input reference signal can result in critical system malfunctioning and/or loss of data.

SUMMARY

In described examples, a first clock generator generates an output clock signal in response to an input reference signal and in response to a feedback signal that is generated in response to the output clock signal. A code generator generates a code in response to the input reference signal. A loss detector generates an indication of a loss of the input reference signal in response to the feedback signal and at least two codes generated by the code generator.

DETAILED DESCRIPTION

Figure 1:
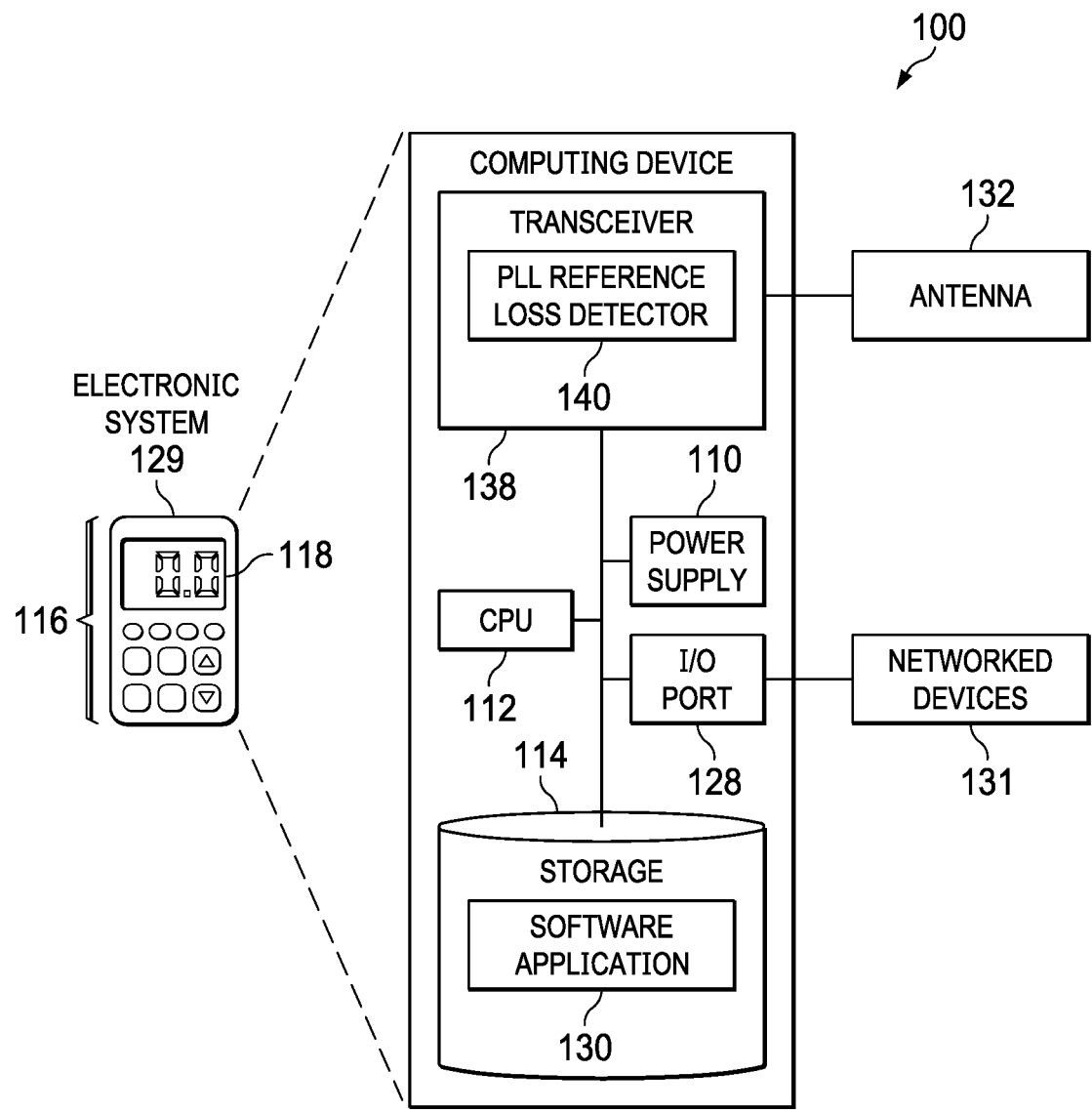
FIG. 1 is a block diagram of a computing device 100 that includes an example code-based, fault detector for a PLL clock generator.

Local clock generation systems can include phase lock loop (PLL) circuits for generating a local system clock in response to an input reference signal. During operation, a PLL feedback clock causes the oscillation of the PLL circuit to converge to the phase of the input reference signal (accordingly, the output frequency of the PLL output signal is also an integer multiple of the input frequency of the input reference signal). Loss of the input reference signal can cause the PLL to lose a phase lock, which results in degradation of the PLL output signal. Loss of the input reference signal that is not detected early (and appropriate mitigation steps taken) can lead to a loss in system integrity (including catastrophic system shutdowns and data loss).

Some PLL circuits include input reference signal loss detection systems that include a separate clock generator to generate a local reference clock cycles count for a ratiometric comparison against a count of input reference clock cycles. However, ratiometric determination increases delays in responding to the loss of the input reference signal (e.g., because the difference between the counts must exceed a certain ratio before detecting a fault condition). Further, the inclusion of the local reference clock increases circuit costs and circuit layout size, power dissipation and noise. In some such input reference signal loss detection systems in which 10- (or more) bit counters are clocked by a 10 MHz local reference clock, around 10 to 100 μs would be required in a ratiometric comparison to detect a loss of a reference frequency ranging from 2 to 100 MHz.

Some of the input reference signal loss detection systems use first and second counters that continuously count respective clock cycles (e.g., clock cycles of the input reference signal, and clock cycles of the locally generated clock independent of the PLL). Using Gray coded or binary coded decimal values for counting generates noise as a result of toggling of counter bits at the harmonic frequency rate of the reference clock. Such electrical noise is generated at specific frequencies related to the input reference signal and can affect the quality of the locally generated PLL signal.

Some of the input reference signal loss detection systems wait to make a determination until one of the first and second counters reaches a terminal count. However, the loss of the input reference signal can occur well before the one of the first and second counters reaches a terminal count. A loss of PLL lock and potential consequences can occur before the loss of the input reference signal is detected (e.g., such that mitigation steps cannot be promptly taken).

Some of the input reference signal loss detection systems include two clocks which oscillate in accordance with separate clock domains. However, the operation of the two clocks in accordance with separate clock domains can be difficult to reconcile, especially when information about the respective clock domains is not known or available. Further, ratiometric comparisons of the respective count values imposes constraints on the respective clocks, wherein the clocks might operate outside of the constraints, such that false-positive indications can be generated by such input reference signal loss detection systems.

The apparatus and methods described herein include a loss detector circuit for detecting a loss of an input reference signal for a PLL circuit. The loss detector circuit includes a code generator that generates a unique code each clock cycle of the input reference clock. A pseudo-random number generator can be used, which generates electrical noise that is not correlated to a particular frequency (such as the harmonic noise that is a multiple of the input reference frequency and that is generated when driving a binary or gray code counters). A PLL-derived clock is used to serially shift the codes through serially chained registers. For example, the PLL-derived clock can be a divided feedback signal that is generated by dividing the feedback signal of the PLL circuit, and in response to the PLL-derived clock, the loss detector is arranged to store the latest generated code as a new value in a first-stage register, to store a previous value of the first-stage register as a new value in a second-stage register, and to transfer a previous value of the second-stage register as a new value to a third-stage register.

The values of each of the registers are compared to ensure that the codes in the registers have mutually exclusive values. In the event of a loss of the input reference signal, new random codes cease to be generated, such that the PLL-derived clock (albeit declining in frequency due to loss of the input reference signal) continues to shift the last-generated random code through the serial chain of registers. The presence of the same value in two or more of the registers provides an indication of a detection of a loss of the input reference signal (e.g., where the indication is detected in as few as two or three clock cycles of the PLL-derived clock after the loss of the input reference signal). The determination of the loss of the input reference signal is signaled to various circuits such that potential damage from the loss of the input reference signal can be mitigated.

FIG. 1 is a block diagram of a computing device 100 that includes an example code-based, fault detector for a PLL clock generator. For example, the computing device 100 is, or is incorporated into, or is coupled (e.g., connected) to an electronic system 129, such as a computer, electronics control "box" or display, controllers (including wireless transmitters or receivers), or any type of electronic system operable to process information.

In example systems, a computing device 100 includes a megacell or a system-on-chip (SoC) that includes control logic such as a central processing unit (CPU) 112, a storage 114 (e.g., random access memory (RAM)) and a power supply 110. For example, the CPU 112 can be a complex instruction set computer (CISC)-type CPU, reduced instruction set computer (RISC)-type CPU, microcontroller unit (MCU), or digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100. The processor is arranged to execute code (e.g., firmware instructions and/or software instructions) for transforming the processor into a special-purpose machine having the structures—and the capability of performing the operations—described herein.

The CPU 112 includes memory and logic circuits that store information that is frequently accessed from the storage 114. The computing device 100 is controllable by a user operating a UI (user interface) 116, which provides output to and receives input from the user during the execution the software application 130. The UI output can include indicators such as the display 118, indicator lights, a speaker, and vibrations. The CPU 112 can be notified of (e.g., signaled in response to) a loss of the input reference signal, for example, by toggling a bit in the status register and/or by interrupting the CPU via a interrupt request (IRQ) or a non-maskable interrupt (NMI). The CPU 112 (and/or associated logic circuitry) can assert the status of the loss of the input reference signal on an output terminal (e.g., output pin), such that externally associated systems can be brought to a "graceful" stop and/or recovery procedure initiated.

The CPU 112 and the power supply 110 are coupled to I/O (Input-Output) port 128, which provides an interface that is configured to receive input from (and/or provide output to) networked devices 131. The networked devices 131 can include any device (including test equipment) capable of point-to-point and/or networked communications with the computing device 100. The computing device 100 can be coupled to peripherals and/or computing devices, including tangible, non-transitory media (such as flash memory) and/or cabled or wireless media. These and other such input and output devices can be selectively coupled to the computing device 100 by external devices using wireless or cabled connections. The storage 114 is accessible, for example, by the networked devices 131. The CPU 112, storage 114, and power supply 110 are also optionally coupled to an external power source (not shown), which is configured to receive power from a power source (such as a battery, solar cell, "live" power cord, inductive field, fuel cell, capacitor, and energy storage devices).

The transceiver 138 includes clock signal generation components for generating a carrier signal for transmitting and receiving signals via the antenna 132. As described herein, the transceiver 138 includes a PLL reference loss detector 140 for determining a loss of the input reference signal, such that, for example, the system 129 is operated within a safe range of operating parameters.

In other examples, the PLL reference loss detector 140 can be included in multiple clock-domain systems, such as multi-processor systems. A first clock generator (e.g. oscillator) can be coupled to transmit an indication of a phase and/or frequency of an output signal of the first clock generator to a second clock generator. The indication of the phase and/or frequency of the first clock generator output signal can be the first clock generator output signal itself, or can be a derivation of the first clock generator output signal, such as a divided first clock generator output signal. A processor (such as CPU 112) can be coupled to receive an output clock signal from the second clock generator, which includes a loss detector (e.g., an input reference signal loss detector). The processor can be arranged to save a context state (such as the contents of the registers of the processor and/or information stored in dynamically clocked RAM) in response to warning or fault signals generated by the loss detector.

Figure 2:
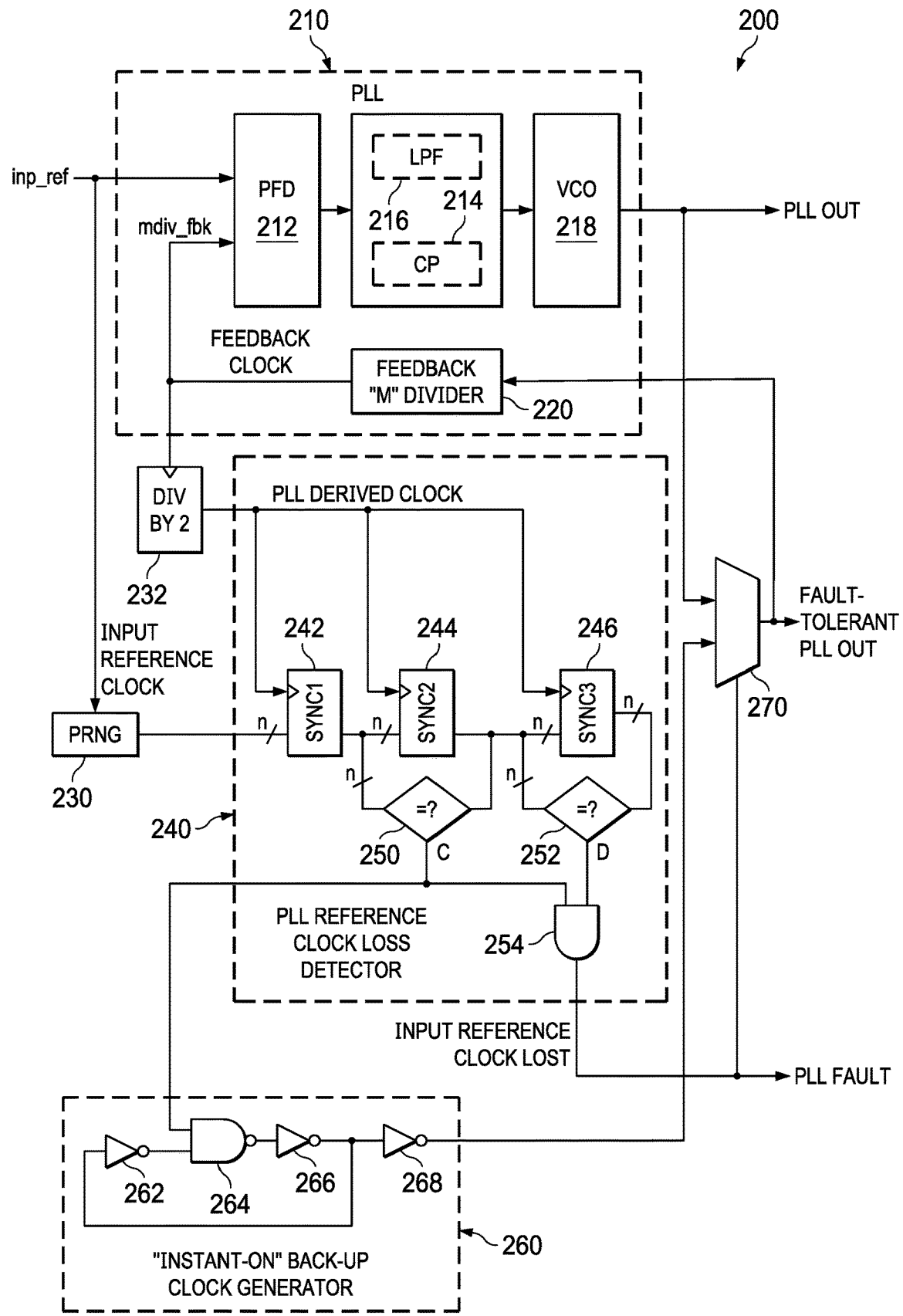
FIG. 2 is a cross-section view of an example code-based, fault tolerant PLL clock generator.

FIG. 2 is a cross-section view of an example code-based, fault tolerant PLL clock generator. The example clock signal generator 200 generally includes a PLL 210, a code generator 230, a PLL reference clock loss detector 240, an optional "instant-on" back-up clock generator 260, and an optional output PLL signal selector 270.

The PLL 210 is arranged to receive the input reference clock signal and, in response, synchronize an oscillator (e.g., VCO 218) to a phase of the input reference clock signal. The code generator 230 is a pseudo-random number generator (PRNG) arranged to receive the input reference clock signal and, in response, to generate a pseudo-random code for every received cycle of the input reference clock signal. The PLL reference clock loss detector 240 is arranged to clock (in response to the PLL-derived clock) each random number generated by the code generator 230 through each synchronization register (242, 244 and 246) and to generate warning and fault signals when two or more of the synchronization registers contain equivalent values.

The optional "instant-on" back-up clock generator 260 is arranged to start oscillating in response to an assertion of the warning signal "C." In the event the loss of the input reference clock signal continues, the fault signal "PLL-fault" is asserted by the PLL reference clock loss detector 240 after the next active transition of the PLL-derived clock (e.g., in response to the assertion of the signal "D"). The optional output PLL signal selector 270 is arrange to select (and output) the output clock signal of the "instant-on" back-up clock generator 260 in response to the assertion of the PLL-fault signal. The fault-tolerant PLL-out signal is optionally available to drive the feedback clock, such that the next or stagnant code can be sampled and compared.

The "warning" signal can be considered to be a "fault" signal (although the confidence in the warning and/or fault signals generated by a lesser number of stages is less than the confidence in warning and/or fault signals generated by a greater number of stages), such that actions (reversible or otherwise) can be taken in response to the warning signal. In one example, a warning signal can be used to perform a "reversible" action (e.g., start an oscillator, pre-charge and output amplifier or other such circuitry), which can reduce latencies otherwise encountered when a fault signal is encountered. If a fault signal is not encountered, the actions taken in response to the warning signal can be ignored or reverted back to an original state such that the operation of the PLL is not otherwise affected. If a fault signal is encountered, "irreversible" actions (such as system shut down, selection of another clock or a change in regulation of the PLL oscillator) can be taken to mitigate the loss of the regulation of the PLL output clock.

As described hereinabove, the PLL 210 is arranged to receive the input reference clock signal and, in response, synchronize an oscillator (e.g., VCO 218) to a phase of the input reference clock signal. The PLL 210 includes a phase frequency detector (PFD) 212, a charge pump (CP) 214, a low pass filter (LPF) 216 and a voltage-controlled oscillator (VCO) 218. The phase frequency detector 212 is arranged to generate a pulsed signal proportional to the phase difference between the input and feedback clock signals. For example, the LPF 216 generates a charge pump input voltage in response to the PFD pulsed signal.

In response to the charge pump input voltage, the charge pump 214 is arranged to control an amount of current for charging a storage capacitor of the charge pump 214. A voltage developed in response to the charge stored in the charge pump 214 is output for controlling the frequency of the VCO 218. An optional "fail-safe" circuit can include circuitry for generating (e.g., maintaining) a minimum charge, such that the output clock of the PLL 210 (when not locked because of a missing input reference signal) can be maintained at a lower frequency. Maintaining the output clock of the PLL 210 (even at a lower frequency) can help assure that non-unique codes (which indicate a failure) are clocked through the synchronization registers (e.g., such that a failure could be detected).

As described hereinabove, the code generator 230 is arrange to receive the input reference clock signal and, in response, to generate a (pseudo) random number for every received cycle of the input reference clock signal. The code generator 230 can be a linear-feedback shift register (LFSR) for generating a random number of "n" bits. The design of the code generator 230 (which includes the number of bits "n" in each random number) is selected such that generating (in response to successive input reference clock cycles) the same random number twice in a row is logically impossible (e.g., as a result of an XOR chain that changes the last-generated code). In the example described hereinbelow with reference to FIG. 3, the number of bits "n" is seven.

The described PLL reference clock loss detector 240 includes three stages for determining a fault (which collectively searches for the same "random" number occurring three times in a row), which further reduces the chance of a false positive (e.g., indication) of a fault to be virtually near zero. For example, the generated pseudo-random numbers between the first two stages have a Hamming distance of greater than 1, whereas the generated pseudo-random numbers between the first stage and the third stage have a Hamming distance of greater than 2. Accordingly, a statistical error (e.g., in which pseudo-random numbers are consecutively sampled twice in a row) is restricted to a single pair of pseudo-random numbers (which can result in the warning signal being generated, but not the fault signal).

As described hereinabove, the PLL reference clock loss detector 240 is arranged to clock (in response to the PLL-derived clock) each random number generated by the code generator 230. The PLL-derived clock is generated by the divider 232, which is arranged to divide the feedback clock by two. Dividing the feedback clock (e.g., by two) slows the rate at which the input reference clock is sampled (and helps avoid potential errors resulting from phase skew of the input reference signal, as described hereinbelow with reference to FIG. 3).

The PLL reference clock loss detector 240 includes three stages (synchronization registers 242, 244 and 246). Each presented pseudo-random number is shifted to a higher order stage in response to the PLL-derived clock (e.g., from the PRNG 230 to the SYNC1 in response to the PLL-derived clock, from the SYNC1 to the SYNC2 in response to the PLL-derived clock, and from the SYNC2 to the SYNC3 in response to the PLL-derived clock). A warning signal "C" is asserted by digital comparator 250 when the stored values of the SYNC1 and SYNC2 registers are equivalent. A fault signal (PLL fault) is generated by AND gate 254 in response to the assertion of the warning signal "C" and the assertion of signal "D," which is asserted by digital comparator 252 when the stored values of the SYNC2 and SYNC3 registers contain equivalent values.

As described hereinabove, the optional "instant-on" back-up clock generator 260 is arranged to start oscillating in response to an assertion of the warning signal "C." The optional "instant-on" back-up clock generator 260 includes inverters 262, 266, 268 and NAND gate 264. During normal operation the warning signal "C" is not asserted (e.g., logic zero), such that the output of NAND gate 264 is logic one, such that the output of inverter 266 is logic zero, such that the output of inverter 262 (and inverter 268) is logic one. Accordingly, the oscillator feedback loop (which includes the inverters 262 and 266 and the NAND gate 264) is stable and does not oscillate (e.g., because the inputs of the NAND gate 264 are not both logic ones).

When the warning signal "C" is asserted (e.g., logic one), both the inputs of the NAND gate 264 are logic ones, which drives the output of the NAND gate 264 to a logic zero, such that the output of the inverter 266 is logic one, such that the output of the inverter 262 (and inverter 268) is logic zero, which toggles the previous value of the particular input terminal of the NAND gate 264, such that the output of the output of NAND gate 264 is logic one, such that the output of inverter 266 is logic zero, such that the output of inverter 262 (and inverter 268) is logic one, which toggles the previous value of the particular input terminal of the NAND gate 264, such that the output of the output of NAND gate 264 is logic zero. Accordingly, the oscillator feedback loop is configured as an astable multivibrator that oscillates at an operating frequency determined in accordance with design parameters assigned to the feedback loop components. The operating frequency of the feedback loop can be, for example, a frequency that is around 25 percent less than the actual output frequency of the PLL out signal.

In the event the loss of the input reference clock signal continues, the fault signal "PLL-fault" is asserted by the PLL reference clock loss detector 240 after the next active transition of the PLL-derived clock (e.g., in response to the assertion of the signal "D"). The optional output PLL signal selector 270 is arrange to select (and output) the back-up clock signal of the "instant-on" back-up clock generator 260 in response to the assertion of the PLL-fault signal. The initial output of the activated back-up clock signal (e.g., as input to the output PLL signal selector 270) is synchronous with respect to the PLL-derived clock, such that the PLL signal selector 270 can be arranged to switch to the back-up clock signal without "glitching."

Accordingly, the fault-tolerant PLL signal (e.g., as output by the PLL signal selector 270) can be used in conjunction with the assertion of the PLL fault signal to mitigate possible consequences of the loss of the synchronicity of the PLL out signal. For example, the PLL fault signal can generate an unmaskable exception for a processor, and the fault-tolerant PLL out signal can be used to clock a processor to save an operating context.

Adding more stages (e.g., fourth, fifth, or more synchronous stages and combinatorial logic) and/or more bits (e.g., 8, 9, 10, 11, or more bits to the code generator 230 and the digital comparators) can increase the robustness of the PLL reference clock loss detector 240 against asserting false-positive indications (such as the warning signal "C" and the PLL-fault signal). Accordingly, the example clock signal generator 200 can be scaled for greater robustness without restrictions. However, such additional circuitry can increase layout requirements, power and latencies in fault detection.

In various examples, a circuit can include a first code register, a second code register, a comparator, a code generator, and a clock circuit. The first code register (e.g. 242) includes a feedback clock input, a first code input coupled with a code output of a code generator, and a first code output. The second code register (e.g., 244) includes a feedback clock input, a second code input coupled with the first code output, and a second code output. The comparator includes a first comparator input coupled with the first code output, a second comparator input coupled with the second code output, and a comparator output. The code generator includes an input coupled with an input reference signal node and a code output coupled with the first code input. The clock circuit includes an input reference signal input coupled with the input reference signal node and a feedback clock output coupled with the feedback clock input of the first and second code registers.

The circuit can further include a frequency divider between the clock circuit feedback clock output and the feedback clock input of the code registers such that the frequency of the feedback clock is lower than the frequency of the input reference signal. The clock circuit can further include a PLL circuit.

The circuit can further include: a third code register with a feedback clock input coupled with the feedback clock output, a third code input coupled with the second code output, and a third code output; and a second comparator with a third comparator input coupled with the second code output, a fourth comparator input coupled with the third code output, and a second comparator output; wherein the first and second comparator outputs are coupled to a logic circuit adapted to indicate a missing input reference signal.

The codes can be the same or different (including randomly generated codes) depending on whether the comparator is an equivalence gate or an exclusive-OR gate, for example. The first and second code registers need not be arranged serially, and can be arranged (for example) in parallel when a modulo counter (e.g., that counts in response to the input reference signal) addresses an enable terminal for storing a respective code value. More than two code registers can be arranged (as described hereinabove) to increase the robustness of an indication of a detection of an a loss of the input reference signal.

A comparator (e.g., 250) is coupled to receive an indication of values for each of the first and second code registers. The comparator is arranged to compare the received indications in response to a feedback signal that is generated in response to the input reference signal. The comparator includes circuitry (e.g., 250, 252, and/or 254) and to output a comparison result of the comparison of the received indications.

The comparison result is an indication (for example) of a loss of the input reference signal when the stored values of the first and second code registers are equal (or, alternatively, not equal), depending on a scheme of changing (or not changing) the stored code values in response to the feedback clock (feedback signal). In the example of FIG. 2, equal values are an indication of the failure of the input reference signal (e.g., because new pseudo-random numbers are not generated). In another example (not shown), a counter can modify a code by performing a first operation (e.g., increment, shift, negate, and other such reversible operations) and the inverse operation can be performed on the stored code values to generate an indication of the unmodified code in response to the feedback clock: in such an example, the code values can be the same, and, when the indications of the unmodified codes are not equal, a loss of the input reference signal is indicated.

In an example operation of the clock signal generator 200 (described hereinbelow with reference to FIG. 3), up to four clock cycles can be required for detecting a loss of the input reference signal (and a warning signal can be generated in two clock cycles). In an example simulation in which a 10 MHz input reference signal is input, a fault signal can be generated in 4 clock cycles of PLL derived clock and a warning signal can be generated in 2 clock cycles of PLL derived clock.

Figure 3:
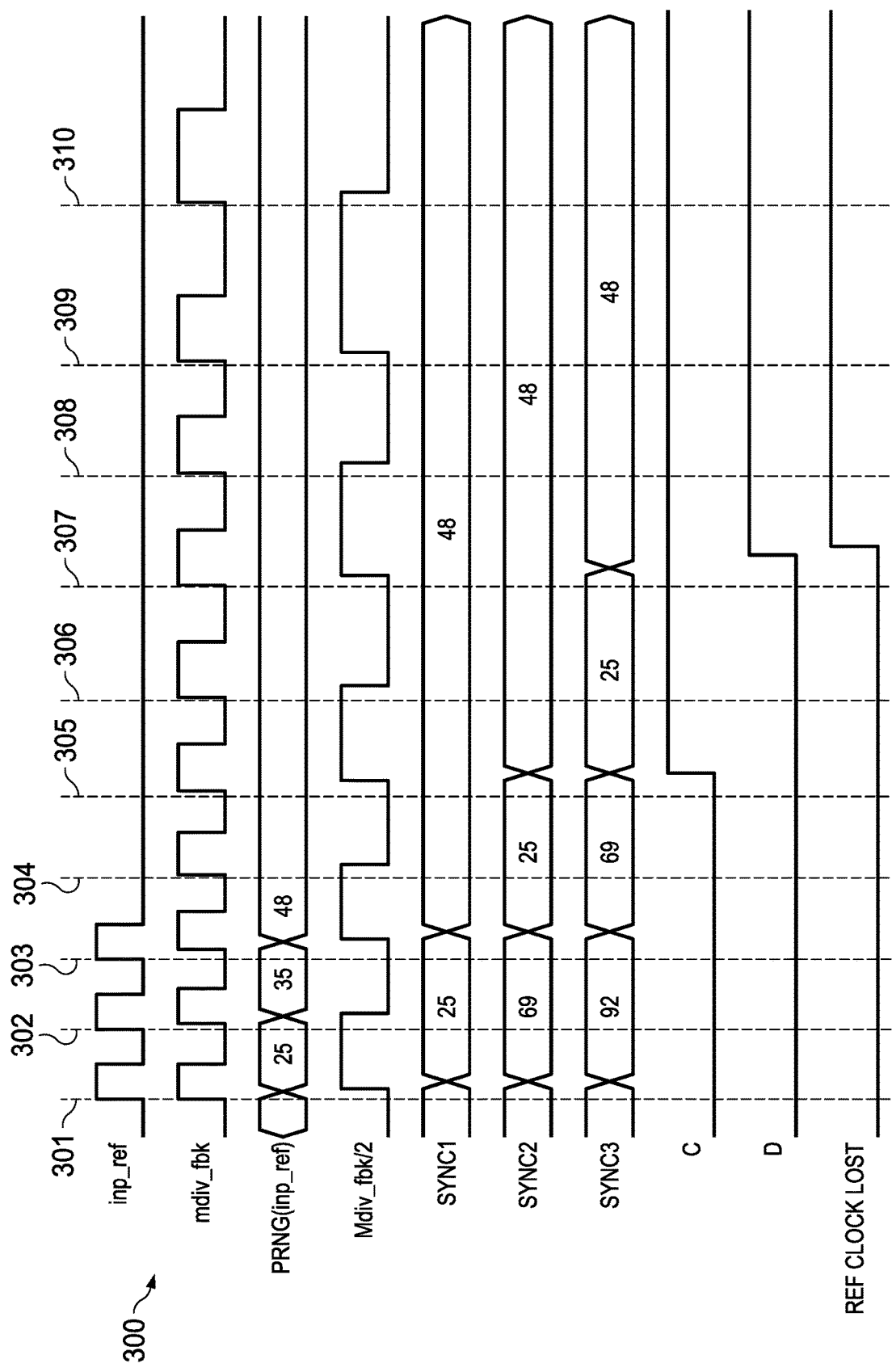
FIG. 3 is a waveform diagram of a simulation of an example code-based, fault tolerant PLL clock generator.

FIG. 3 is a waveform diagram of a simulation of an example code-based, fault tolerant PLL clock generator. Generally described, the example simulation 300 shows operation of the clock signal generator 200 (described hereinabove with respect to FIG. 2) for detecting loss of an input reference signal of the PLL 210.

At time 301, the first pulse of the input reference signal (INP_REF) is received by the PLL 210 (e.g., where each such pulse includes a 50 percent duty cycle). At the time 301 in the simulation 300, the PLL 210 is oscillating in a phase-locked state in response to the input reference signal. Accordingly, the feedback clock (MDIV_FBK) is stable and is phase-aligned with the input reference signal (or at least the previously received pulse of the input reference signal). The PLL-derived clock (MDIV_FBK/2) is generated by dividing the feedback clock by two (accordingly, the PLL-derived clock is developed in response to the input reference signal and closely phase aligned by the feedback clock signal of the feedback control loop). In response to the rising edge of the input reference signal near time 301: the code generator 230 generates and asserts the pseudo-random number 25. Also near time 301, the PLL-derived clock toggles high, such that a rising edge is asserted. In response to the rising edge of the PLL-derived clock: the first-stage synchronous register (SYNC1) 242 latches the first-generated pseudo-random number 25 asserted by the code generator 230; the second-stage synchronous register (SYNC2) 244 latches the previously generated pseudo-random number 69 previously stored in the first-stage synchronous register 242; and the third-stage synchronous register (SYNC3) 246 latches the previously generated pseudo-random number 92 previously stored in the second-stage synchronous register 244. The rising edge of the PLL-derived clock signal is delayed with respect to the rising edge of the input reference signal, such that the setup and hold times for latching an input of the first-stage synchronous register (SYNC1) 242 are not violated.

At time 302, a second pulse of the input reference signal (INP_REF) is received by the PLL 210. Further, the feedback clock generates a second pulse that is phase-aligned with the second pulse input reference signal (or at least the previously received first pulse of the input reference signal). In response to the rising edge of the input reference signal at time 302: the code generator 230 generates and asserts the pseudo-random number 35. Also near time 302, the PLL-derived clock toggles low (such that a falling edge is asserted). Because the PLL-derived clock asserts a falling edge, the first-stage synchronous register (SYNC1) 242 does not latch the next-generated pseudo-random number 35 asserted by the code generator 230. Accordingly, every-other pseudo-random number generated by the code generator 230 is latched. Sampling every-other pseudo-random number helps ensure that in cases where the rising edge of the input reference signal occurs after the rising edge of the PLL-derived clock, the previously generated pseudo-random number is not sampled twice by the first-stage synchronous register (SYNC1) 242. Accordingly, sampling every-other pseudo-random number helps to avoid false-positive indications from being asserted via the warning signal "C" and the PLL-fault signal when, for example, instabilities in frequency (but not absence of) the input reference signal cause phase differences between the input reference signal and the feedback clock.

At time 303, the third pulse of the input reference signal (INP_REF) is received by the PLL 210. Further, the feedback clock generates a third pulse that is phase-aligned with the pulse of the input reference signal (or at least the previously received second pulse of the input reference signal). In response to the rising edge of the input reference signal at time 303: the code generator 230 generates and asserts the pseudo-random number 48. Also near time 303, the PLL-derived clock toggles high (such that a rising edge is asserted). In response to the rising edge of the PLL-derived clock: the first-stage synchronous register (SYNC1) 242 latches the pseudo-random number 48 currently asserted by the code generator 230; the second-stage synchronous register (SYNC2) 244 latches the previously generated pseudo-random number 25 previously stored in the first-stage synchronous register 242; and the third-stage synchronous register (SYNC3) 246 latches the previously generated pseudo-random number 69 previously stored in the second-stage synchronous register 244.

At time 304, a subsequent pulse of the input reference signal (INP_REF) is not received by the PLL 210. However, the feedback clock generates a fourth pulse that is phase-aligned with the previously received third pulse of the input reference signal. Because the input reference signal does not rise around time 304, the code generator 230 does not generate and assert a new pseudo-random number, and instead maintains assertion of the previously generated pseudo-random number 48. Near time 304, the PLL-derived clock toggles low (such that a falling edge is asserted).

At time 305, the next pulse of the input reference signal (INP_REF) is not received (e.g., still not received) by the PLL 210. Further, the feedback clock generates a fifth pulse that is less phase-aligned with a pulse of the input reference signal. For example, the period between each of the cycles of the feedback clock continues to progressively increase in duration, albeit slowly, in response to (for example) a decrease of charge stored in the charge pump 214 for controlling the frequency of the VCO 218. Because the input reference signal at time 305 does not include a rising edge, the code generator 230 does not generate and assert a new pseudo-random number, and instead maintains assertion of the previously generated pseudo-random number 48. Also near time 305, the PLL-derived clock toggles high (such that a rising edge is asserted). In response to the rising edge of the PLL-derived clock: the first-stage synchronous register (SYNC1) 242 latches (e.g., re-latches) the pseudo-random number 48 currently asserted by the code generator 230; the second-stage synchronous register (SYNC2) 244 latches the previously latched pseudo-random number 48 previously stored in the first-stage synchronous register 242; and the third-stage synchronous register (SYNC3) 246 latches the previously generated pseudo-random number 25 previously stored in the second-stage synchronous register 244. Because the first-stage synchronous register (SYNC1) 242 and the second-stage synchronous register (SYNC2) 244 include equivalent values (e.g., the value 48), the warning signal "C" is asserted (e.g., by digital comparator 250).

At time 306, a subsequent pulse of the input reference signal (INP_REF) is not received by the PLL 210. However, the feedback clock generates a sixth pulse that is even less phase-aligned with the previously received third pulse of the input reference signal. Because the input reference signal does not rise around time 306, the code generator 230 does not generate and assert a new pseudo-random number (and instead maintains assertion of the previously generated pseudo-random number 48). Also near time 306, the PLL-derived clock toggles low (such that a falling edge is asserted).

At time 307, the next pulse of the input reference signal (INP_REF) is not received (e.g., continues to be not received) by the PLL 210. However, the feedback clock generates a seventh pulse that is further even less phase-aligned with the last-received pulse of the input reference signal. For example, the period between each cycles of the feedback clock continues to progressively grow, in response to (for example) the continuing decrease of charge stored in the charge pump 214. Because the input reference signal at time 307 does not include a rising edge, the code generator 230 does not generate and assert a new pseudo-random number, and instead continues to maintain the assertion of the previously generated pseudo-random number 48. Near time 307, the PLL-derived clock toggles high (such that a rising edge is asserted). In response to the rising edge of the PLL-derived clock: the first-stage synchronous register (SYNC1) 242 latches (e.g., re-latches) the pseudo-random number 48 currently asserted by the code generator 230; the second-stage synchronous register (SYNC2) 244 latches the previously latched pseudo-random number 48 previously stored in the first-stage synchronous register 242; and the third-stage synchronous register (SYNC3) 246 latches the previously generated pseudo-random number 48 previously stored in the second-stage synchronous register 244. Because the first-stage synchronous register (SYNC1) 242 and the second-stage synchronous register (SYNC2) 244 include equivalent values (e.g., the value 48), the warning signal "C" is asserted (e.g., remains asserted). Because the second-stage synchronous register (SYNC2) 244 and the third-stage synchronous register (SYNC3) 246 include equivalent values (e.g., the value 48), the third-stage warning signal "D" is asserted. Because the warning signals "C" and "D" are both asserted, the PLL-fault signal (REF. CLOCK LOST) is asserted. Because the assertion of the PLL-fault signal requires both the warning signals "C" and "D" to both asserted, the PLL-fault signal is not asserted in the case where the first-stage synchronous register (SYNC1) 242 and the second-stage synchronous register (SYNC2) 244 do not contain the equivalent values (such as during a case in which only one or two input reference clocks pulses are missing and the input reference clock is once again properly received).

At time 308, a subsequent pulse of the input reference signal (INP_REF) is not received by the PLL 210. However, the feedback clock generates an eighth pulse that is even less further phase-aligned with the previously received third pulse of the input reference signal. Because the input reference signal does not rise around time 308, the code generator 230 does not generate and assert a new pseudo-random number (and instead maintains assertion of the previously generated pseudo-random number 48). Also around time 308, the PLL-derived clock toggles low (such that a falling edge is asserted). The first-stage synchronous register (SYNC1) 242, the second-stage synchronous register (SYNC2) 244 and the third-stage synchronous register (SYNC3) 246 all continue to store and output the same value (e.g., 48), such that the PLL-fault signal and the warning signals "C" and "D" remain asserted.

At time 309, the next pulse of the input reference signal (INP_REF) is not received (e.g., still not received) by the PLL 210. Around time 309, the feedback clock generates a ninth pulse that continues to progressively be less phase-aligned with the last-received pulse of the input reference signal. Because the input reference signal at time 309 does not include a rising edge, the code generator 230 does not generate and assert a new pseudo-random number (and instead continues to maintain the assertion of the previously generated pseudo-random number 48). Near time 309, the PLL-derived clock toggles high (such that a rising edge is asserted). In response to the rising edge of the PLL-derived clock: the first-stage synchronous register (SYNC1) 242 latches (e.g., re-latches) the pseudo-random number 48 currently asserted by the code generator 230; the second-stage synchronous register (SYNC2) 244 latches the previously latched pseudo-random number 48 currently stored in the first-stage synchronous register 242; and the third-stage synchronous register (SYNC3) 246 latches the pseudo-random number 48 previously stored in the second-stage synchronous register 244. The first-stage synchronous register (SYNC1) 242, the second-stage synchronous register (SYNC2) 244 and the third-stage synchronous register (SYNC3) 246 all continue to store and output the same value (e.g., 48), such that the PLL-fault signal and the warning signals "C" and "D" remain asserted.

At time 310, a subsequent pulse of the input reference signal (INP_REF) is not received by the PLL 210. However, the feedback clock generates an tenth pulse that continues to be progressively less phase-aligned with the previously received third pulse of the input reference signal. Because the input reference signal does not rise around time 310, the code generator 230 does not generate and assert a new pseudo-random number (and instead maintains assertion of the previously generated pseudo-random number 48). Also around time 308, the PLL-derived clock toggles low (such that a falling edge is asserted). The first-stage synchronous register (SYNC1) 242, the second-stage synchronous register (SYNC2) 244 and the third-stage synchronous register (SYNC3) 246 all continue to store and output the same value (e.g., 48), such that the PLL-fault signal and the warning signals "C" and "D" remain asserted.

In another example clock signal generator 200, the code generator 230 is clock counter arranged to receive the input reference clock signal and, in response, to increment a value (and output the counter value as a code) for every received cycle of the input reference clock signal. The clock counter example of the code generator 230 is also arranged to decrement the counter by a count of two in response to the PLL-derived clock. Accordingly, the counter maintains the same value (or a value incremented by one) as long as the input reference clock is validly present. An example PLL reference clock loss detector (not shown) is arranged to clock (in response to the PLL-derived clock) each code generated by the code generator 230 through first- second- and third-stage synchronization registers. A warning signal can be generated in response to the values of the first- and the second-stage synchronization registers. Similarly, a fault signal can be generated in response to the values of the first-, second- and third-stage synchronization registers.

Modifications are possible in the described embodiments, and other embodiments are possible, within the scope of the claims.

What is claimed is:

1. An electronic circuit comprising:
   a first input configured to receive a first signal synchronized to a first clock signal;
   a second input configured to receive a second signal synchronized to a second clock signal;
   a comparator circuit coupled to the first input and the second input, the comparator circuit configured to perform a comparison of the first signal and the second signal; and
   an output configured to output a fault signal based on the comparison, wherein the first signal is an output from a clock divider or the second signal is an output from a code generator configured to generate a code in response to an input reference signal.

2. The electronic circuit of claim 1, further comprising a clock divider configured to output the first signal.

3. The electronic circuit of claim 1, further comprising a code generator configured to output the second signal comprising a code in response to the input reference signal.

4. An electronic circuit, comprising:
   a first input configured to receive a first signal synchronized to a first clock signal;
   a second input configured to receive a second signal synchronized to a second clock signal;
   a comparator circuit coupled to the first input and the second input, the comparator circuit configured to perform a comparison of the first signal and the second signal; and
   an output configured to output a fault signal based on the comparison, wherein the comparator circuit comprises:
   a first register having a first register input coupled to the first input, a second register input coupled to the second input, and a first register output;
   a second register having a third register input coupled to the first input, a fourth register input coupled to the first register output, and a second register output; and
   a third register having a fifth register input coupled to the first input, a sixth register input coupled the second register output, and a third register output.

5. The electronic circuit of claim 4, wherein the comparator circuit includes:
   a first comparator configured to compare the first register output and the second register output; and
   a second comparator configured to compare the second register output and the third register output.

6. The electronic circuit of claim 5, wherein:
   the first comparator outputs a first fault signal in response to the first register output equating to the second register output; and the second comparator outputs a second fault signal in response to the second register output equating to the third register output.

7. The electronic circuit of claim 6, further comprising: a logical AND configured to receive the first fault signal and the second fault signal.

8. An electronic circuit, comprising:
a first input configured to receive a first signal synchronized to a first clock signal;
a second input configured to receive a second signal synchronized to a second clock signal;
a comparator circuit coupled to the first input and the second input, the comparator circuit configured to perform a comparison of the first signal and the second signal;
an output configured to output a fault signal based on the comparison; and
a multiplexer having a control input coupled to the fault signal.

9. The electronic circuit of claim 8, further comprising a clock generator having an input coupled to an output of the comparator circuit, and an output coupled to a first input of the multiplexer.

10. A method comprising:
receiving a first signal synchronized to a first clock signal;
receiving a second signal synchronized to a second clock signal;
at a first clock cycle of the first signal, storing a first value based on the second signal in a first register;
at a second clock cycle of the first signal, storing a second value based on the second signal in the first register, and storing the first value in a second register; and
at a third clock cycle, storing a third value based on the second signal in the first register, storing the second value in the second register, and storing the first value in a third register;
determining a comparison based on an output of the first, second, or third registers; and
outputting a fault signal based on the comparison.

11. The method of claim 10, wherein:
the first signal is an output from a clock divider.

12. The method of claim 10, wherein:
the second signal is an output from a code generator generating a code in response to an input reference signal.

13. The method of claim 10, further comprising:
comparing, by a first comparator, the output of the first register with the output of the second register; and
comparing, by a second comparator, the output of the second register with the output of the third register.

14. The method of claim 13, wherein:
the first comparator outputs a first fault signal in response to the output of the first register equating the output of the second register; and
the second comparator outputs a second fault signal in response to the output of the second register equating the output of the third register.

15. The method of claim 14, further comprising:
processing, by a logical AND circuit, the first fault signal and the second fault signal.

16. The method of claim 10, further comprising:
configuring a multiplexer based the fault signal.

17. An electronic circuit comprising:
a first input;
a second input;
a set of registers, each coupled to the first input, wherein an input of a first register of the set of registers is coupled to an output of a second register of the set of registers, wherein the second register is coupled to the second input;
a first comparator coupled to the input of the first register and an output of the first register, the first comparator configured to perform a comparison of a signal from the input of the first register and a signal from the output of the first register; and
an output configured to output a fault signal based on the comparison.

18. The electronic circuit of claim 17, wherein the set of register comprises a third register having an input coupled to the output of the first register, the electronic circuit further comprising a second comparator coupled to the input of the third register and to an output of the third register.

19. The electronic circuit of claim 18, further comprising a logic circuit coupled to an output of the first comparator and to an output of the second comparator.

20. The electronic circuit of claim 17, wherein the set of registers are configured to receive a signal synchronized to a clock signal.

* * * * *